(12) United States Patent
Cheng et al.

(10) Patent No.: US 8,754,527 B2
(45) Date of Patent: Jun. 17, 2014

(54) SELF ALIGNED BORDERLESS CONTACT

(75) Inventors: Kangguo Cheng, Schenectady, NY (US); Rahhavasimhan Sreenivasan, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 13/562,341

(22) Filed: Jul. 31, 2012

(65) Prior Publication Data

US 2014/0035141 A1 Feb. 6, 2014

(51) Int. Cl.
*H01L 23/48* (2006.01)
*H01L 21/20* (2006.01)
*B44C 1/22* (2006.01)

(52) U.S. Cl.
USPC .............................. 257/751; 216/67; 438/396

(58) Field of Classification Search
USPC ............. 257/316, 369, 774; 216/67; 438/305, 438/643, 660
See application file for complete search history.

(56) References Cited

U.S. PATENT DOCUMENTS

| 6,602,435 B1 * | 8/2003 | Yamada et al. ................. 216/67 |
| 7,867,889 B2 | 1/2011 | Besling |
| 7,923,337 B2 | 4/2011 | Chang et al. |
| 7,928,006 B2 * | 4/2011 | Besling .......................... 438/643 |
| 8,232,607 B2 | 7/2012 | Edge et al. |
| 2010/0120245 A1 * | 5/2010 | Tjandra et al. ................ 438/660 |
| 2012/0024713 A1 * | 2/2012 | Preisser ........................ 205/123 |
| 2012/0276657 A1 * | 11/2012 | Joubert et al. ..................... 438/3 |
| 2012/0276752 A1 * | 11/2012 | Rangarajan et al. .......... 438/761 |
| 2013/0183835 A1 * | 7/2013 | Nguyen et al. ................ 438/793 |

\* cited by examiner

*Primary Examiner* — Ha Tran T Nguyen
*Assistant Examiner* — Ismail Muse
(74) *Attorney, Agent, or Firm* — L. Jeffrey Kelly; Daniel H. Schnurmann

(57) ABSTRACT

A method of fabricating a semiconductor structure having a borderless contact, the method including providing a first semiconductor device adjacent to a second semiconductor device, the first and second semiconductor devices being formed on a semiconductor substrate, depositing a non-conductive liner on top of the semiconductor substrate and the first and second semiconductor devices, depositing a contact level dielectric layer on top of the non-conductive liner, etching a contact hole in the contact-level dielectric between the first semiconductor device and the second semiconductor device, and selective to the non-conductive liner, converting a portion of the non-conductive liner exposed in the contact hole into a conductive liner; and forming a metal contact in the contact hole.

8 Claims, 11 Drawing Sheets

SELF ALIGNED BORDERLESS CONTACT

FIELD OF THE INVENTION

The present disclosure generally relates to integrated circuits, and more particularly to fabricating semiconductor devices having borderless contacts.

BACKGROUND OF INVENTION

Contacts may be formed in order to make electrical connections to a semiconductor device. Contacts to a source region or a drain region of the semiconductor device may be referred to as CA contacts. CA contacts may be distinguished from CG contact which may form an electrical connection to the gate conductor of a semiconductor device. The source and drain regions must remain electrically insulated from the gate terminal in order to maintain functionality of the semiconductor device. Conversely, a short circuit between the source and drain regions and the gate terminal may damage the semiconductor device. A CA contact may be formed in a contact hole etched in a contact-level dielectric, and therefore would be surrounded by the contact-level dielectric. As a result of device scaling the need for borderless contacts has increased. A borderless contact may include CA contacts located in close proximity to surrounding semiconductor devices such that no amount of contact-level dielectric separates the CA contact from the semiconductor device structure.

As semiconductor devices shrink in each generation of semiconductor technology, formation of CA contact structures becomes more challenging because there is an increased risk of a short circuit between the gate terminal and the CA contact. The risk of a short circuit may be increased because the gate terminal and the CA contact may only be separated by a device spacer which may be susceptible to damage during etching the contact hole. Therefore, the likelihood of CA contacts shorting to the gate terminal of a semiconductor device increases in each generation. This problem may have a significant impact on product yield and reliability.

Fabrication of a CA contact may include the formation of an etch stop liner prior to the formation of the metal contact. The etch stop liner may be used as a robust liner to prevent damage of the underlying semiconductor device structure during etching of the contact hole. The etch stop liner may then be selectively removed from the bottom of the CA trench to allow for an electrical connection to the source/drain region. For example, the etch stop liner may include silicon nitride. An etch stop liner having a thickness of about 5 nm may function well as an etch stop, however, it decreases the CA contact opening and consequently decreases the effective CA contact width by about 10 nm. Such a reduction in the CA contact width may adversely increase the CA contact resistance. This is particularly problematic for future CMOS technology which typically has very small diameter CA contact holes.

There is therefore a continuing need for an improved method for fabricating borderless CA contacts to a semiconductor device.

SUMMARY

According to one embodiment of the present disclosure, a method of fabricating a semiconductor structure having a borderless contact is provided. The method may include providing a first semiconductor device adjacent to a second semiconductor device, the first and second semiconductor devices being formed on a semiconductor substrate, depositing a non-conductive liner on top of the semiconductor substrate and the first and second semiconductor devices, and depositing a contact level dielectric layer on top of the non-conductive liner. The method may also include etching a contact hole in the contact-level dielectric between the first semiconductor device and the second semiconductor device, and selective to the non-conductive liner, converting a portion of the non-conductive liner exposed in the contact hole into a conductive liner; and forming a metal contact in the contact hole.

According another exemplary embodiment, a semiconductor structure having a borderless contact is provided. The structure may include a first semiconductor device adjacent to a second semiconductor device, the first and second semiconductor devices being formed on a semiconductor substrate, a non-conductive liner located on top of a portion of the first and second semiconductor devices, the non-conductive liner being covered by a contact-level dielectric, and a conductive liner located on top of a portion of the first and second semiconductor devices, the conductive liner being covered by a metal contact, the non-conductive liner and the conductive liner includes compounds of the same chemical elements in differing ratios.

According another exemplary embodiment, a semiconductor structure having a borderless contact is provided. The structure may include a first semiconductor device adjacent to a second semiconductor device, the first and second semiconductor devices being formed on a semiconductor substrate, a non-conductive liner located on top of a portion of the first and second semiconductor devices, the non-conductive liner being covered by a contact-level dielectric, a conductive liner located on top of a portion of the first and second semiconductor devices, the conductive liner being covered by a metal contact, and a nitride layer located on top of the conductive liner, the non-conductive liner and the conductive liner includes the same elements, but different ratios of those elements.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIG. 3 depicts the formation of silicides above a source region and a drain region according to one embodiment.

FIG. 4 depicts the deposition of a non-conductive liner followed by the deposition of an inter-level dielectric according to one embodiment.

FIG. 5 depicts the formation of a contact hole and subsequent phase conversion of a portion of the non-conductive liner according to one embodiment.

FIG. 6 depicts the deposition of a metal contact according to one embodiment.

FIG. 9 depicts the formation of silicides above a source region and a drain region according to one embodiment.

FIG. 10 depicts the deposition of a non-conductive liner followed by the deposition of an inter-level dielectric according to one embodiment.

FIG. 11 depicts the formation of a contact hole and subsequent deposition of a nitrogen absorption layer according to one embodiment.

FIG. 12 depicts the phase conversion of a portion of the non-conductive liner and the nitrogen absorption layer according to one embodiment.

FIG. 13 depicts the deposition of a metal contact according to one embodiment.

FIG. 16 depicts the formation of silicides above a source region and a drain region according to one embodiment.

FIG. 17 depicts the deposition of a non-conductive liner followed by the deposition of an inter-level dielectric according to one embodiment.

FIG. 18 depicts the formation of a contact hole according to one embodiment.

FIG. 19 depicts the removal of a portion of the non-conductive liner according to one embodiment.

FIG. 20 depicts the deposition of a metal contact according to one embodiment.

DETAILED DESCRIPTION

Figure 1:
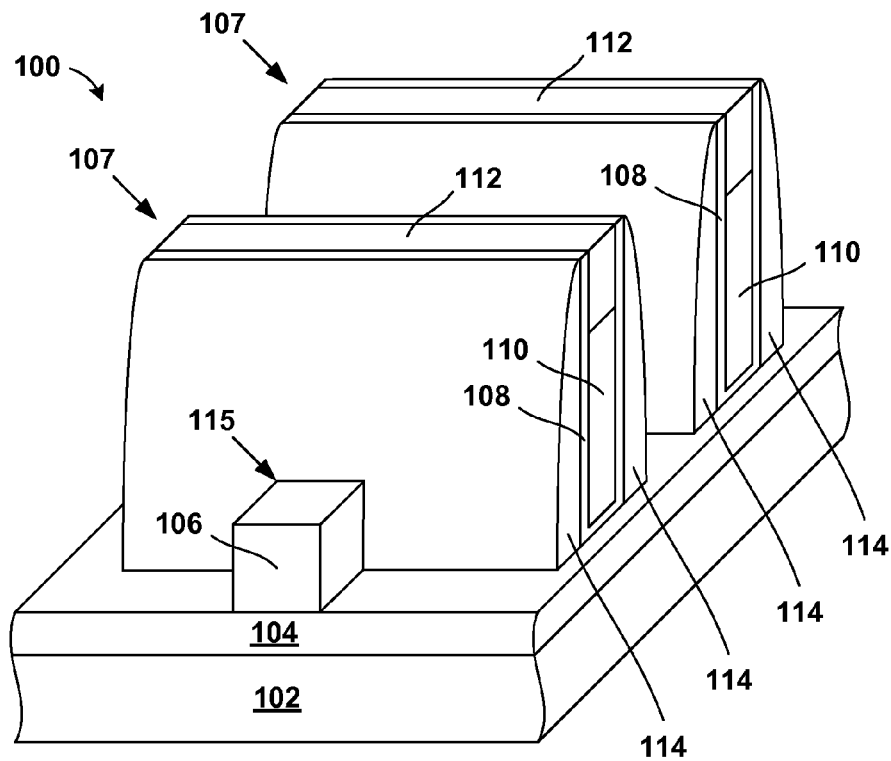
FIG. 1 depicts an isometric view of a finFET semiconductor device according to one embodiment.

Detailed embodiments of the claimed structures and methods are disclosed herein; however, it can be understood that the disclosed embodiments are merely illustrative of the claimed structures and methods that may be embodied in various forms. This disclosure may, however, be embodied in many different forms and should not be construed as limited to the exemplary embodiment set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The drawings are not necessarily to scale. The drawings are merely schematic representations, not intended to portray specific parameters of the invention. The drawings are intended to depict only typical embodiments of the invention. In the drawings, like numbering represents like elements.

A finFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate. It should be noted that the invention disclosed below may be fabricated using either a replacement gate or gate last process flow, or a gate first process flow. A replacement gate process flow will be relied on for the description provided below.

In a replacement gate (RG) fabrication approach, a semiconductor substrate may be patterned and etched to form fins. Next, a dummy gate may be formed in a direction perpendicular to the length of the fins. For example, the dummy gate may be pattered and etched from a polysilicon layer. A pair of device spacers can be disposed on opposite sidewalls of the dummy gate. The dummy gates and the pair of device spacers may then be surrounded by an inter-level dielectric. Later, the dummy gate may be removed from between the pair of device spacers, as by, for example, an anisotropic vertical etch process such as a reactive ion etch (RIE). This creates an opening between the pair of device spacers where a metal gate may then be formed between the pair of device spacers. Optionally, a gate dielectric may be configured below the metal gate.

Referring now to FIG. 1, an isometric view of a structure 100 is shown at an intermediate step during replacement gate process flow. At this step of fabrication the structure 100 may be generally complete with a gate structure 107 formed over a fin 115 etched from a semiconductor-on-insulator (SOI) substrate and after an inter-level dielectric has been removed. It should be noted that the gate structure 107 and fin 115 may be formed in any semiconductor substrate know to a person having ordinary skill in the art, including but not limited to SOI substrates and bulk silicon substrates. Also, it should be noted that while this description refers to some components of the structure 100 in the singular tense, more than one component may be depicted throughout the figures and like components are labeled with like numerals.

The SOI substrate employed in the present invention may include a base substrate 102, a buried dielectric layer 104 (e.g., buried oxide) formed on top of the base substrate 102, and a SOI layer 106 formed on top of the buried dielectric layer 104. The buried dielectric layer 104 isolates the SOI layer 106 from the base substrate 102. The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 102 may be about, but is not limited to, several hundred microns thick. For example, the base substrate 102 may include a thickness ranging from 0.5 mm to about 1.5 mm.

The buried dielectric layer 104 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. In one embodiment, the buried dielectric layer 104 may be about 150 nm thick. Alternatively, the buried dielectric layer 104 may include a thickness ranging from about 10 nm to about 500 nm.

The SOI layer 106 may include any of the several semiconductor materials included in the base substrate 102. In general, the base substrate 102 and the SOI layer 106 may include either identical or different semiconducting materials with respect to chemical composition, dopant concentration and crystallographic orientation. In one particular embodiment of the present invention, the base substrate 102 and the SOI layer 106 include semiconducting materials that include at least different crystallographic orientations. Typically the base substrate 102 or the SOI layer 106 include a {110} crystallographic orientation and the other of the base substrate 102 or the SOI layer 106 includes a {100} crystallographic orientation. Typically, the SOI layer 106 includes a thickness ranging from about 5 nm to about 100 nm. Methods for forming the SOI layer 106 are well known in the art. Non-limiting examples include SIMOX (Separation by Implantation of Oxygen), wafer bonding, and ELTRAN® (Epitaxial Layer TRANsfer). It may be understood by a person having ordinary skill in the art that fins.

The fins 115 may be etched from the SOI substrate using typical photolithography techniques. The fins 115 may be primarily formed from the SOI layer 106 of the SOI substrate. In one embodiment the fins 115 may include multiple layers in addition to the SOI layer 106 of the SOI substrate. For example, an oxide layer (not shown) and a nitride layer (not shown) may be formed on a top surface of the SOI layer 106, where the nitride layer may be located directly on top of the oxide layer.

The oxide layer may include a silicon oxide or a silicon oxynitride. In one embodiment, the oxide layer can be formed, for example, by thermal or plasma conversion of a top surface of the SOI layer 106 into a dielectric material such as silicon oxide or silicon oxynitride. In one embodiment, the oxide layer can be formed by deposition of silicon oxide or silicon oxynitride by chemical vapor deposition (CVD) or atomic layer deposition (ALD). The oxide layer may have a thickness ranging from about 1 nm to about 10 nm, although a thickness less than 1 nm and greater than 10 nm may be acceptable. In one embodiment, the oxide layer may be about 5 nm thick.

The nitride layer may include an insulating material such as, for example, silicon nitride. The nitride layer may be formed using conventional deposition methods, for example, low-pressure chemical vapor deposition (LPCVD). In one embodiment, the nitride layer may have a thickness ranging from about 5 nm to about 100 nm. In one particular embodiment, the nitride layer may be about 50 nm thick.

The gate structure 107 may include a gate dielectric 108, a metal gate 110, a gate cap 112, and a pair of device spacers 114. The gate dielectric 108 may be formed after removal of the dummy gate during the replacement gate process flow. The gate dielectric 108 can be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The gate dielectric 108 may also be formed using any combination of the above processes.

The gate dielectric 108 may include an insulating material including, but not limited to: oxide, nitride, oxynitride or silicate including metal silicates and nitrided metal silicates. In one embodiment, the gate dielectric 108 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 108 may vary, but typically may have a thickness ranging from about 0.5 nm to about 10 nm. More preferably the gate dielectric 108 may have a thickness ranging from about 0.5 nm to about 3 nm.

The metal gate 110 may be formed on top of the gate dielectric 108. The metal gate 110 may be deposited by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). The metal gate 110 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one embodiment, the metal gate 110 may be tungsten. Furthermore, the gate cap 112 may be formed on top of the metal gate 110 using any suitable deposition technique known in the art. The gate cap 112 may include, for example, TiN, W, Ti, Al, Ta, TaN, Co, and Ni.

The gate dielectric 108, the metal gate 110, the gate cap 112 may be referred to as a gate stack. The gate stack may have the pair of device spacers 114 located on opposite sidewalls of the gate stack; however, in a replacement gate process flow the pair of device spacers 114 may be formed around a dummy gate stack prior to the formation of the gate dielectric 108, the metal gate 110, the gate cap 112. The pair of device spacers 114 may be made from an insulator such as an oxide, nitride, oxynitride, or any combination thereof. The pair of device spacers 114 may be typically made from a different material than the gate cap 112. In one embodiment, the pair of device spacers 114 may be made form a nitride and may be formed by conventional deposition and etching techniques.

Figure 2:
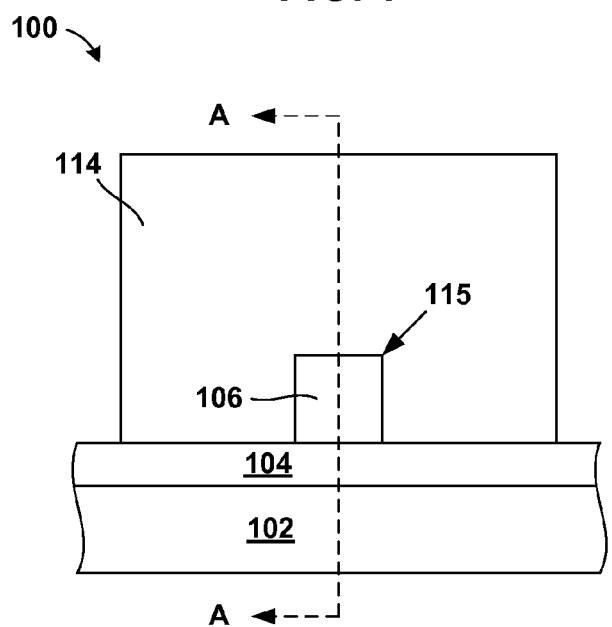
FIG. 2 depicts the front view of FIG. 1 according to one embodiment.

Referring now to FIG. 2, a front view of the structure 100 in FIG. 1 is shown. In the front view, only the base substrate 102, the buried dielectric layer 104, the SOI layer 106 (i.e. the fin 115), and one of the pair of device spacers 114 are visible.

Referring now to FIGS. 3-6, exemplary process steps of forming FETs, such as finFETs, having a borderless CA contact in accordance with one embodiment of the present invention are shown, and will now be described in greater detail below. It should be noted that FIGS. 3-6 all represent the cross section view, section A-A, of FIG. 2. The borderless CA contact may be formed between two adjacent semiconductor devices as depicted in FIGS. 3-6. Generally, a borderless CA contact may be used when the spacing between the two adjacent semiconductor devices is less than the current ground rule limitations. For example, in 22 nm processes, the ground rules may limit the formation of a contact to a minimum of 30 nm. Therefore, maximizing the effective width of a CA contact is important when the minimum width of the contact is greater than the distance between two adjacent semiconductor devices.

Figure 3:
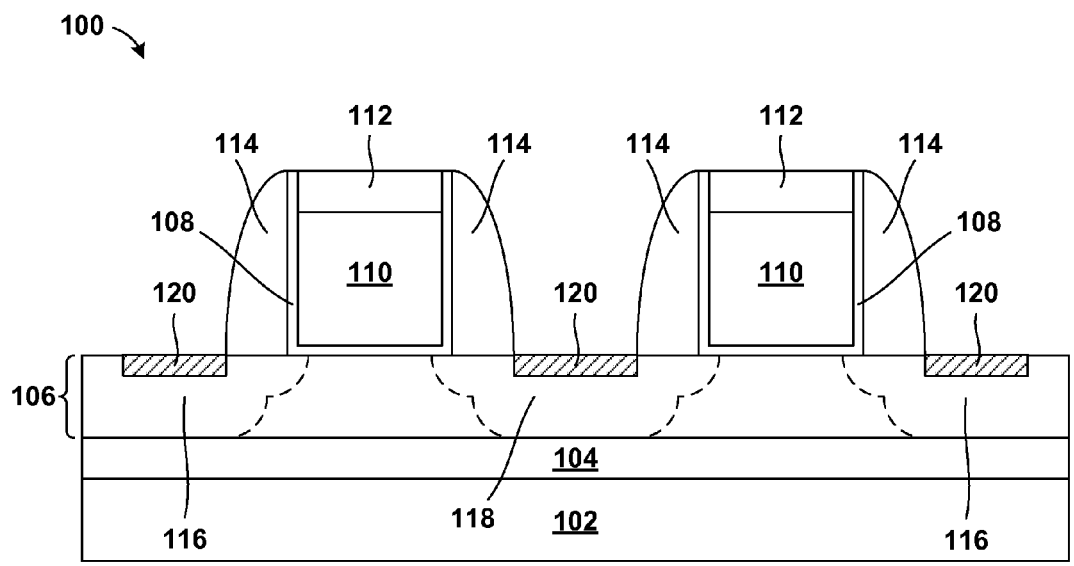
FIGS. 3-6 depict section A-A of FIG. 2 and illustrate the steps of a method of fabricating a borderless CA contact according to one embodiment.

Referring now to FIG. 3, the structure 100 is shown after the removal of the inter-level dielectric. The SOI layer 106 may be doped, undoped, or contain both doped and undoped regions therein. These doped regions can be used to define various device regions, for example a source region 116 and a drain region 118. The source/drain regions 116, 118, for example, may be either n-doped or p-doped. Typically, n-doped source/drain regions are used for forming n-channel field effect transistors (n-FETs), and p-doped source/drain regions are used for forming p-channel field effect transistors (p-FETs). However, the source/drain regions of one device on a semiconductor substrate may be n-doped while the source/drain regions of another device on the same semiconductor substrate may be p-doped. The source/drain regions 116, 118 can be formed using ion implantation process followed by an annealing process. The annealing process serves to activate the dopants that were implanted by the previous implant process. The conditions for the ion implantation and annealing are well known to persons having ordinary skill in the art. The phrase "source/drain regions" may include extension regions, halo regions, and deep source/drain regions. It should be noted that the source drain regions 116, 118 may be formed by doping the SOI layer 106 either before the formation of the inter-level dielectric in the replacement gate process flow or after the removal of the inter-level dielectric as the shown in FIG. 3.

With continued reference to FIG. 3, embedded silicide contacts 120 may be formed in the source/drain regions 116, 118 within the SOI layer 106. The embedded silicide contacts 120 may be formed by first depositing a metal alloy layer (not shown). The metal alloy layer may be formed using any suitable deposition technique known in the art including, but not limited to: chemical vapor deposition (CVD), plasma-assisted CVD, high-density chemical vapor deposition (HD-CVD), plating, sputtering, evaporation, and chemical solution deposition. The deposition of the metal alloy layer may be continued until an initial thickness of about 25 nm or less, preferably about 15 nm or less, even more preferably about 10 nm or less, is produced.

In one embodiment, the metal alloy layer may include a nickel-platinum (NiPt) alloy. The metal alloy layer may include a nickel concentration ranging from about 70 to about 95 atomic percent. Preferably, nickel may be present in the alloy in an amount ranging from about 90 to about 95 atomic percent. The remainder may be platinum and, if present, another metal. In one embodiment, the metal alloy layer may include NiPd, NiRe, Ti, TiTa, TiNb, or Co.

The other metal or alloying additive that can be optionally present in the NiPt alloy layer may include Pd, Rh, Ti, V, Cr, Zr, Nb, Mo, Ht, Ta, W, or Re. In one embodiment, the other alloying additive may be Re. When present, the alloying additive is present in an amount ranging from about 0 to about 50 atomic percent with an amount ranging from about 0.1 to about 20 atomic percent being more typical. More preferably, the other metal is present in an amount ranging from about 0.5 to about 10 atomic percent.

Next, an annealing step may be carried out at a relatively low annealing temperature, ranging from about 150° C. to about 500° C. using either a continuous heating regime or various ramp and soak heating cycles, for a duration ranging from about 1 second to about 1000 seconds. More preferably, the annealing step may be carried out at an annealing temperature ranging from about 200° C. to about 400° C. and for a duration ranging from about 5 seconds to about 500 seconds. Most preferably, the annealing step may be carried out at an annealing temperature ranging from about 250° C. to about 350° C. and for a duration ranging from about 10 seconds to about 100 seconds. In one embodiment, the annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the annealing step may be terminated by lowering the surrounding temperature of the entire structure to below 100° C. within a time period from about 10 seconds to about 1000 seconds.

The annealing step, as described above, may be generally referred to as a low-temperature rapid thermal annealing (RTA) step. As a result of the low-temperature RTA step, nickel contained in the portions of the metal alloy layer located directly over the source/drain regions 116, 118 of the SOI layer 106 reacts with silicon contained in the source/drain regions 116, 118 to form the embedded silicide contacts 120. The embedded silicide contacts 120 may include, at a minimum, nickel and silicon. In some embodiments, the nickel silicides may also include another metal or alloying additive as discussed above. The embedded silicide contacts 120 formed after the low-temperature RTA step, may extend into the silicon material of the source/drain regions 116, 118 about 5 nm to about 30 nm, with a depth from about 5 nm to about 20 nm being even more typical. Any suitable etching technique known in the art may be used to remove an unreacted portion of the metal alloy layer remaining on any non-silicon containing surfaces.

Figure 4:
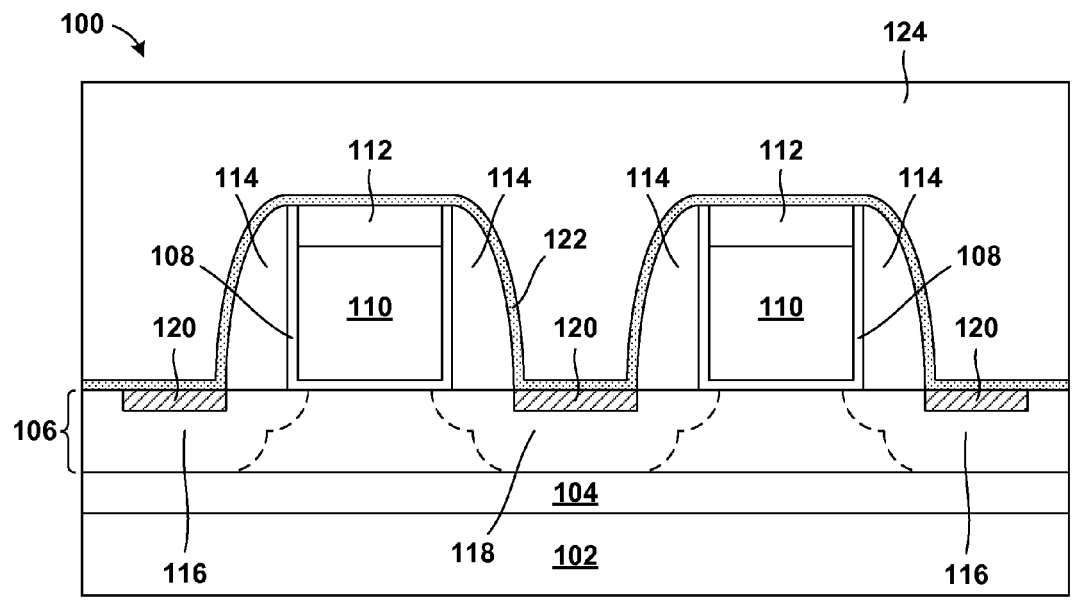

Referring now to FIG. 4, a non-conductive liner 122 may be deposited on top of the structure 100. In one embodiment, the non-conductive liner 122 may include, but is not limited to, a material made from tantalum nitride, ruthenium nitride, or any combination of these materials. The non-conductive liner 122 may be deposited using any suitable deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof.

The non-conductive liner 122 should serve as a dielectric barrier layer, to prevent the transmission of electrical current. In one embodiment, the non-conductive liner 122 may include tantalum nitride deposited using an atomic layer deposition (ALD) technique. Atomic layer deposition may be the preferred method of depositing the non-conductive liner 122 because its uniformity and controllability. Tantalum nitride is a well-known barrier against copper diffusion. When tantalum nitride is deposited from the vapor phase using ALD the non-conductive $Ta_3N_5$ phase is always obtained due to the low deposition temperatures normally encountered in ALD. The non-conductive liner 122 may have a thickness ranging from about 2 nm to about 20 nm, although a thickness of the non-conductive liner 122 less than 2 nm or greater than 20 nm is acceptable. More typically, the non-conductive liner 122 may have a thickness ranging from about 4 nm to about 10 nm.

A contact-level dielectric 124 may be deposited on top of the structure 100 using any suitable deposition technique known in the art. In one embodiment, the contact-level dielectric 124 may include, but is not limited to, a material made from, a nitride, an oxide, a carbide, or any combination of these materials. In one embodiment, the contact-level dielectric 124 may include an oxide deposited using a CVD deposition technique. The contact-level dielectric 124 may have a thickness ranging from about 20 nm to 100 nm, although a thickness of the non-conductive liner 122 less than 20 nm or greater than 100 nm is acceptable. The contact-level dielectric 124 may be planarized using a chemical-mechanical polishing technique after being formed on top of the structure 100.

Figure 5:
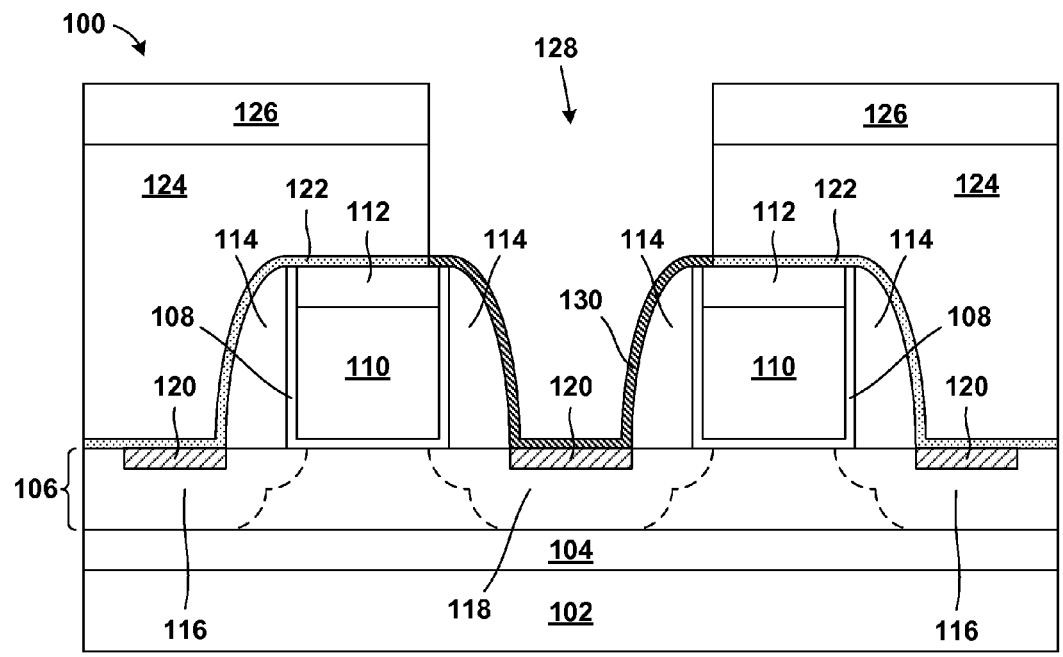

Referring now to FIG. 5, a mask 126 may be applied above the contact-level dielectric 124, and a contact hole 128 may be etched through the contact-level dielectric 124 to expose the embedded silicide contacts 120. A person having ordinary skill in the art will recognize that in various embodiments, a contact "hole" may be a circular opening or a trench extending for a length on the SOI layer 106. A portion of the contact-level dielectric 124 may be removed using any suitable etching technique such as dry etch, wet etch, or combination of both, however, the removal technique may be selective to the non-conductive liner 122. In one embodiment, reactive ion etching may be used to form the contact hole 128 selective to the non-conductive liner 122. The non-conductive liner 122 functions as an etch stop during the removal of the portion of the contact-level dielectric 124 and the formation of the contact hole 128. If the non-conductive liner 122 were absent the device spacers 114 may be damaged by the etching technique used to form the contact hole 128, and therefore may cause a short circuit between the metal gate 110 and a CA contact later formed in the contact hole 128.

Next, a plasma treatment may be used to convert an exposed portion of the non-conductive liner 122 from an insulator to a conductive liner 130. A portion of the non-conductive liner 122 remaining beneath the contact-level dielectric 124 may remain an insulator and is not changed by the plasma treatment. In one embodiment, a $Ta_3N_5$ non-conductive liner may be converted into a TaN conductive liner, and the portion of the non-conducting liner 122 beneath the contact-level dielectric 124 may remain $Ta_3N_5$. The $Ta_3N_5$ phase can be transformed into the conductive TaN phase by a soft argon plasma treatment. This is significant when a low resistive interface may be desired.

It has been demonstrated that the Ta/N ratio may be reduced from 3:5 to 1:1 by applying a 120 sec argon plasma at 300 W AC bias. The resistivity of the liner may be significantly reduced. It may be understood by a person having ordinary skill in the art that $Ta_3N_5$ may have a considerably higher electrical resistance than TaN. The resulting conductive liner 130 may have a thickness ranging from about 2 to about 20 although a thickness of the conductive liner 130 less than 2 nm or greater than 20 nm is acceptable. It should be noted that the plasma treatment may cause the thickness of the non-conductive liner 122 to shrink during its phase transformation to the conductive liner 130.

However, it will be appreciated that there may be a whole range of plasma conditions which can be used (e.g. direct/remote, different chemistries, different power, different times, etc) and it will be apparent to a person skilled in the art that suitable conditions to be used will be dependent on several factors. For example, even the plasma used during the etching process may be able to transform an ALD $Ta_3N_5$ layer into a conductive layer, and may be dependant on the thickness of the ALD $Ta_3N_5$ layer that needs to be transformed. If the thickness is relatively small (for example <5 nm), mild plasmas can be used to effect the transformation process. If, however, the thickness is greater than 5 nm (which may be preferable from the perspective of its role as etch stop during the contact hole etching process), then different plasma conditions may be necessary for the transformation process. Of course, on the other hand, it is preferred to make the film as thin as possible to leave enough space to deposit a conductive material in the contact hole 128.

The mask 126 may then be removed after the plasma treatment. The mask 126 may be removed using any suitable etching technique such as dry etch, wet etch, or combination of both, however, the removal technique may be selective to the contact-level dielectric 124.

Figure 6:
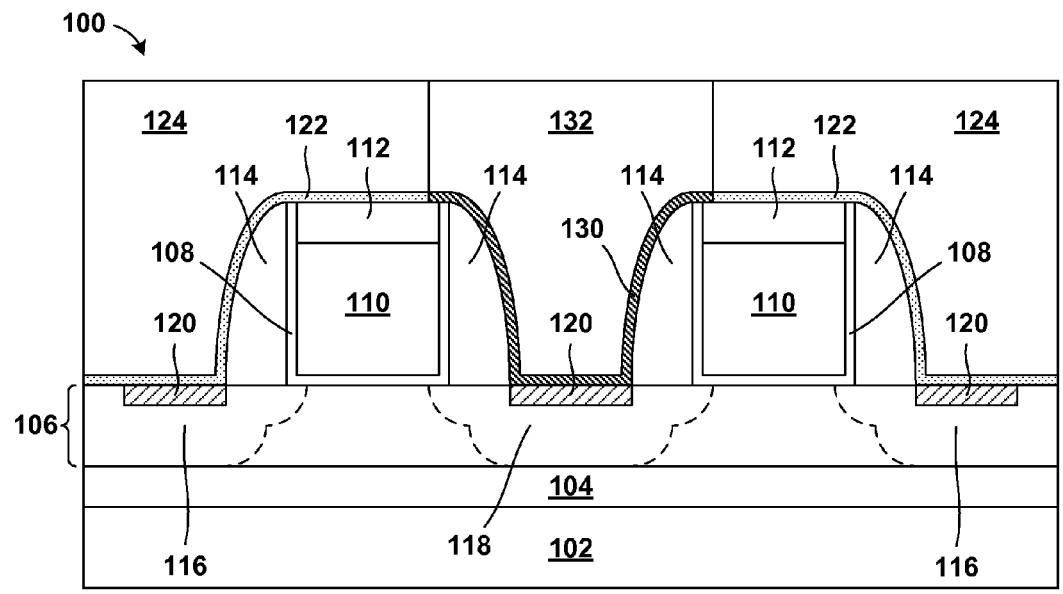

Now referring to FIG. 6, a conductive material 132 may be deposited to fill the contact hole 128. The conductive material 132 may include a material having a high electrical conductivity. The conductive material 132 can include, for example: tungsten, copper, aluminum, silver, gold, alloys thereof, and any suitable combination thereof. The conductive material 132 can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The thickness, or depth, of the conductive material 132, may range from about 30 nm to about 600 nm, although lesser and greater thicknesses may also be used. After deposition, a planarization process such as CMP may be performed to remove any contact metal above the contact-level dielectric 124.

Therefore, converting the non-conductive liner 122 to a conductive liner 130 in fabricating a borderless CA contact has multiple advantages over known techniques. First, the non-conductive liner 122 may serve as a sufficient etch stop during etching of the contact hole 128. Second, because of the conductive properties of the subsequently formed conductive liner 130 removal of the non-conductive liner 122 may not be necessary to obtain the maximum possible CA contact width. Because the non-conductive liner 122 is never removed, an etching step may be eliminated, thus greatly reducing the possibility of damaging the pair of device spacers 114. Third, the remaining conductive liner 130 may neither unnecessarily constrict the width of the CA contact nor unnecessarily increase the CA contact's resistance because of its conductive properties.

Figure 7:
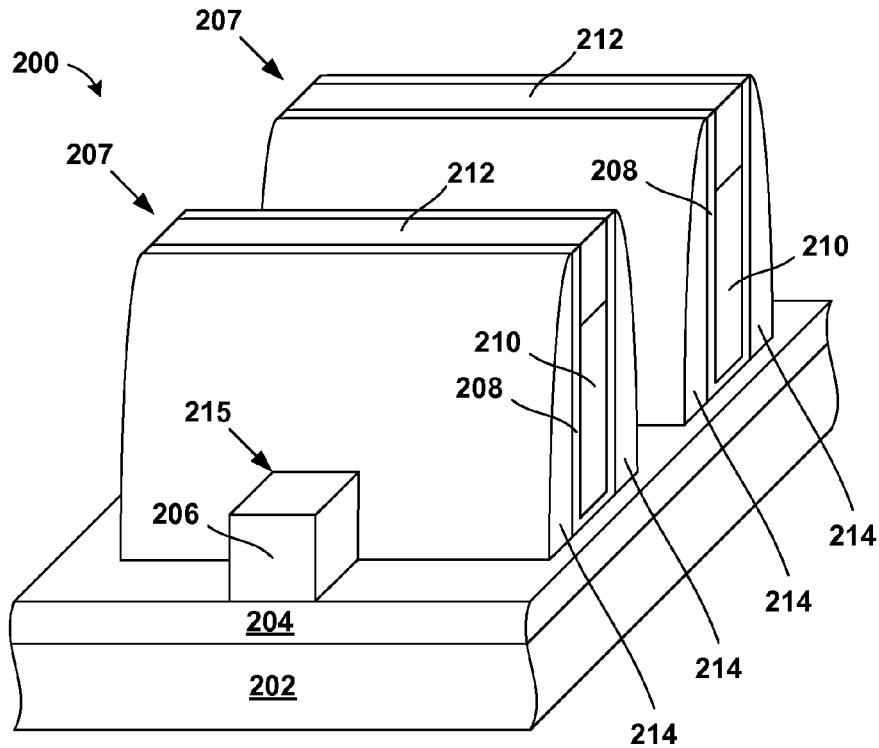
FIG. 7 depicts an isometric view of a finFET semiconductor device according to one embodiment.

Referring now to FIG. 7, an isometric view of a structure 200 is shown at an intermediate step during replacement gate process flow. At this step of fabrication the structure 200 may be generally complete with a gate structure 207 formed over a fin 215 etched from a semiconductor-on-insulator (SOI) substrate and after an inter-level dielectric has been removed. It should be noted that the gate structure 207 may be formed in any semiconductor substrate know to a person having ordinary skill in the art, including but not limited to SOI substrates and bulk silicon substrates. Also, it should be noted that while this description refers to some components of the structure 200 in the singular tense, more than one component may be depicted throughout the figures and like components are labeled with like numerals.

The SOI substrate employed in the present invention may include a base substrate 202, a buried dielectric layer 204 (e.g., buried oxide) formed on top of the base substrate 202, and a SOI layer 206 formed on top of the buried dielectric layer 204. The buried dielectric layer 204 isolates the SOI layer 206 from the base substrate 202. The base substrate 202 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 202 may be about, but is not limited to, several hundred microns thick. For example, the base substrate 202 may include a thickness ranging from 0.5 mm to about 1.5 mm.

The buried dielectric layer 204 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 204 may include crystalline or non-crystalline dielectric material. Moreover, the buried dielectric layer 204 may be formed using any of several known methods. Non-limiting examples include ion implantation methods, thermal or plasma oxidation or nitridation methods, chemical vapor deposition methods and physical vapor deposition methods. In one embodiment, the buried dielectric layer 204 may be about 150 nm thick. Alternatively, the buried dielectric layer 204 may include a thickness ranging from about 10 nm to about 500 nm.

The SOI layer 206 may include any of the several semiconductor materials included in the base substrate 202. In general, the base substrate 202 and the SOI layer 206 may include either identical or different semiconducting materials with respect to chemical composition, dopant concentration and crystallographic orientation. In one particular embodiment of the present invention, the base substrate 202 and the SOI layer 206 include semiconducting materials that include at least different crystallographic orientations. Typically the base substrate 202 or the SOI layer 206 include a {110} crystallographic orientation and the other of the base substrate 202 or the SOI layer 206 includes a {100} crystallographic orientation. Typically, the SOI layer 206 includes a thickness ranging from about 5 nm to about 100 nm. Methods for forming the SOI layer 206 are well known in the art. Non-limiting examples include SIMOX (Separation by Implantation of Oxygen), wafer bonding, and ELTRAN® (Epitaxial Layer TRANsfer).

The fins 215 may be etched from the SOI substrate using typical photolithography techniques. The fins 215 may be primarily formed from the SOI layer 206 of the SOI substrate. In one embodiment the fins 215 may include multiple layers in addition to the SOI layer 206 of the SOI substrate. For example, an oxide layer (not shown) and a nitride layer (not shown) may be formed on a top surface of the SOI layer 206, where the nitride layer may be located directly on top of the oxide layer.

The oxide layer may include a silicon oxide or a silicon oxynitride. In one embodiment, the oxide layer can be formed, for example, by thermal or plasma conversion of a top surface of the SOI layer 206 into a dielectric material such as silicon oxide or silicon oxynitride. In one embodiment, the oxide layer can be formed by deposition of silicon oxide or silicon oxynitride by chemical vapor deposition (CVD) or atomic layer deposition (ALD). The oxide layer may have a thickness ranging from about 1 nm to about 10 nm, although a thickness less than 1 nm and greater than 10 nm may be acceptable. In one embodiment, the oxide layer may be about 5 nm thick.

The nitride layer may include an insulating material such as, for example, silicon nitride. The nitride layer may be formed using conventional deposition methods, for example, low-pressure chemical vapor deposition (LPCVD). In one embodiment, the nitride layer may have a thickness ranging from about 5 nm to about 100 nm. In one particular embodiment, the nitride layer may be about 50 nm thick.

The gate structure 207 may include a gate dielectric 208, a metal gate 210, a gate cap 212, and a pair of device spacers 214. The gate dielectric 208 may be formed after removal of the dummy gate during the replacement gate process flow. The gate dielectric 208 can be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The gate dielectric 208 may also be formed using any combination of the above processes.

The gate dielectric 208 may include an insulating material including, but not limited to: oxide, nitride, oxynitride or silicate including metal silicates and nitrided metal silicates. In one embodiment, the gate dielectric 208 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 208 may vary, but typically may have a thickness ranging from about 0.5 nm to about 10 nm. More preferably the gate dielectric 208 may have a thickness ranging from about 0.5 nm to about 3 nm.

The metal gate 210 may be formed on top of the gate dielectric 208. The metal gate 210 may be deposited by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). The metal gate 210 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one embodiment, the metal gate 210 may include tungsten. Furthermore, the gate cap 212 may be formed on top of the metal gate 210 using any suitable deposition technique known in the art. The gate cap 212 may include, for example, TiN, W, Ti, Al, Ta, TaN, Co, and Ni.

The gate dielectric 208, the metal gate 210, the gate cap 212 may be referred to as a gate stack. The gate stack may have the pair of device spacers 214 located on opposite sidewalls of the gate stack; however, in a replacement gate process flow the pair of device spacers 214 may be formed around a dummy gate stack prior to the formation of the gate dielectric 208, the metal gate 210, the gate cap 212. The pair of device spacers 214 may be made from an insulator such as an oxide, nitride, oxynitride, or any combination thereof. The pair of device spacers 214 may be typically made from a different material than the gate cap 212. In one embodiment, the pair of device spacers 214 may be made form a nitride and may be formed by conventional deposition and etching techniques.

Figure 8:
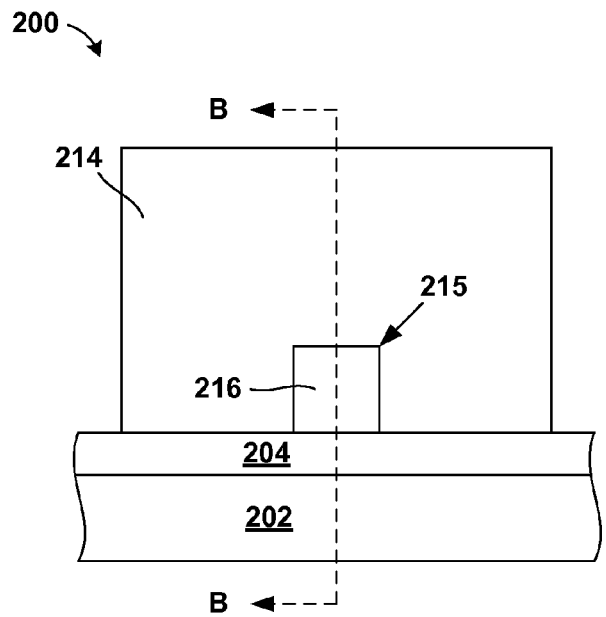
FIG. 8 depicts the front view of FIG. 7 according to one embodiment.

Referring now to FIG. 8, a front view of the structure 200 in FIG. 1 is shown. In the front view, only the base substrate 202, the buried dielectric layer 204, the SOI 206 (i.e. the fin 215), and one of the pair of device spacers 214 are visible.

Referring now to FIGS. 9-13, exemplary process steps of forming FETs, such as finFETs, having a borderless CA contact in accordance with one embodiment of the present invention are shown, and will now be described in greater detail below. It should be noted that FIGS. 9-13 all represent the cross section view, section B-B, of FIG. 8. The borderless CA contact may be formed between two adjacent semiconductor devices as depicted in FIGS. 9-13. Generally, a borderless CA contact may be used when the spacing between the two adjacent semiconductor devices is less than the current ground rule limitations. For example, in 22 nm processes, the ground rules may limit the formation of a contact to a minimum of 30 nm. Therefore, maximizing the effective width of a CA contact is important when the minimum width of the contact is greater than the distance between two adjacent semiconductor devices.

Figure 9:
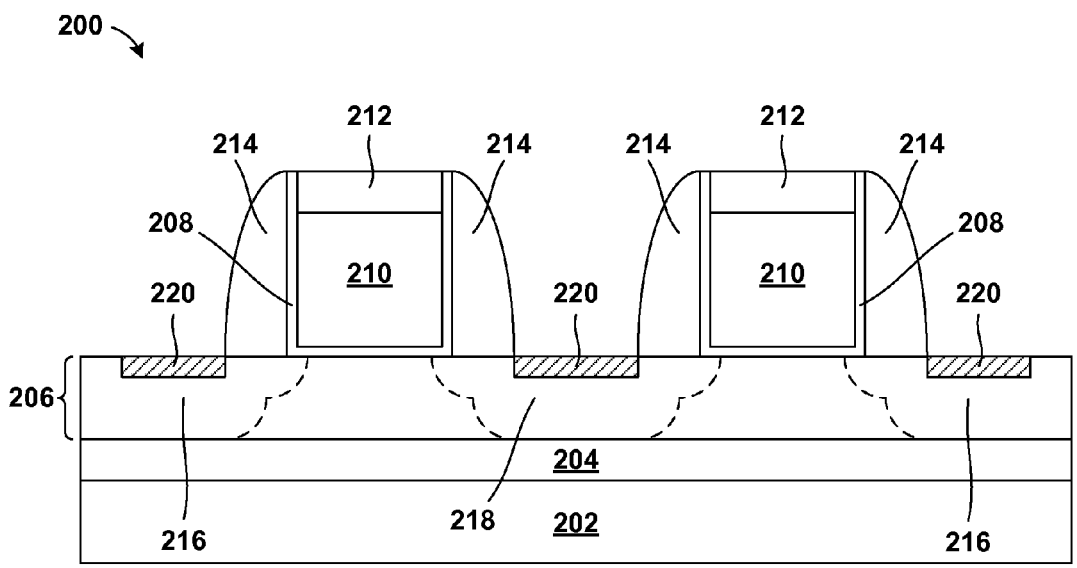
FIGS. 9-13 depict section B-B of FIG. 8 and illustrate the steps of a method of fabricating a borderless CA contact according to one embodiment.

Referring now to FIG. 9, the structure 200 is shown after the removal of the inter-level dielectric. The SOI layer 206 may be doped, undoped, or contain both doped and undoped regions therein. These doped regions can be used to define various device regions, for example a source region 216 and a drain region 218. The source/drain regions 216, 218, for example, may be either n-doped or p-doped. Typically, n-doped source/drain regions are used for forming n-channel field effect transistors (n-FETs), and p-doped source/drain regions are used for forming p-channel field effect transistors (p-FETs). However, the source/drain regions of one device on a semiconductor substrate may be n-doped while the source/drain regions of another device on the same semiconductor substrate may be p-doped. The source/drain regions 216, 218 can be formed using ion implantation process followed by an annealing process. The annealing process serves to activate the dopants that were implanted by the previous implant process. The conditions for the ion implantation and annealing are well known to persons having ordinary skill in the art. The phrase "source/drain regions" may include extension regions, halo regions, and deep source/drain regions. It should be noted that the source drain regions 216, 218 may be formed by doping the SOI layer 206 either before the formation of the inter-level dielectric in the replacement gate process flow or after the removal of the inter-level dielectric as the shown in FIG. 3.

With continued reference to FIG. 9, embedded silicide contacts 220 may be formed in the source/drain regions 216, 218 within the SOI layer 206. The embedded silicide contacts 220 may be formed by first depositing a metal alloy layer (not shown). The metal alloy layer may be formed using any suitable deposition technique known in the art including, but not limited to: chemical vapor deposition (CVD), plasma-assisted CVD, high-density chemical vapor deposition (HD-CVD), plating, sputtering, evaporation, and chemical solution deposition. The deposition of the metal alloy layer may be continued until an initial thickness of about 25 nm or less, preferably about 15 nm or less, even more preferably about 10 nm or less, is produced.

In one embodiment, the metal alloy layer may include a nickel-platinum (NiPt) alloy. The metal alloy layer may include a nickel concentration ranging from about 70 to about 95 atomic percent. Preferably, nickel may be present in the alloy in an amount ranging from about 90 to about 95 atomic percent. The remainder may be platinum and, if present, another metal. In one embodiment, the metal alloy layer may include NiPd, NiRe, Ti, TiTa, TiNb, or Co.

The other metal or alloying additive that can be optionally present in the NiPt alloy layer may include Pd, Rh, Ti, V, Cr, Zr, Nb, Mo, Ht, Ta, W, or Re. In one embodiment, the other alloying additive may be Re. When present, the alloying additive is present in an amount ranging from about 0 to about 50 atomic percent with an amount ranging from about 0.1 to about 20 atomic percent being more typical. More preferably, the other metal is present in an amount ranging from about 0.5 to about 10 atomic percent.

Next, an annealing step may be carried out at a relatively low annealing temperature, ranging from about 150° C. to about 500° C. using either a continuous heating regime or various ramp and soak heating cycles, for a duration ranging from about 1 second to about 1000 seconds. More preferably, the annealing step may be carried out at an annealing temperature ranging from about 200° C. to about 400° C. and for a duration ranging from about 5 seconds to about 500 seconds. Most preferably, the annealing step may be carried out at an annealing temperature ranging from about 250° C. to about 350° C. and for a duration ranging from about 10 seconds to about 100 seconds. In one embodiment, the annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the annealing step may be terminated by lowering the surrounding temperature of the entire structure to below 100° C. within a time period from about 10 seconds to about 1000 seconds.

The annealing step, as described above, may be generally referred to as a low-temperature rapid thermal annealing (RTA) step. As a result of the low-temperature RTA step, nickel contained in the portions of the metal alloy layer located directly over the source/drain regions 216, 218 of the SOI layer 206 reacts with silicon contained in the source/drain regions 216, 218 to form the embedded silicide contacts 220. The embedded silicide contacts 220 may include, at a minimum, nickel and silicon. In some embodiments, the nickel silicides may also include another metal or alloying additive as discussed above. The embedded silicide contacts 220 formed after the low-temperature RTA step, may extend into the silicon material of the source/drain regions 216, 218 about 5 nm to about 30 nm, with a depth from about 5 nm to about 20 nm being even more typical. Any suitable etching technique known in the art may be used to remove an unreacted portion of the metal alloy layer remaining on any non-silicon containing surfaces.

Figure 10:
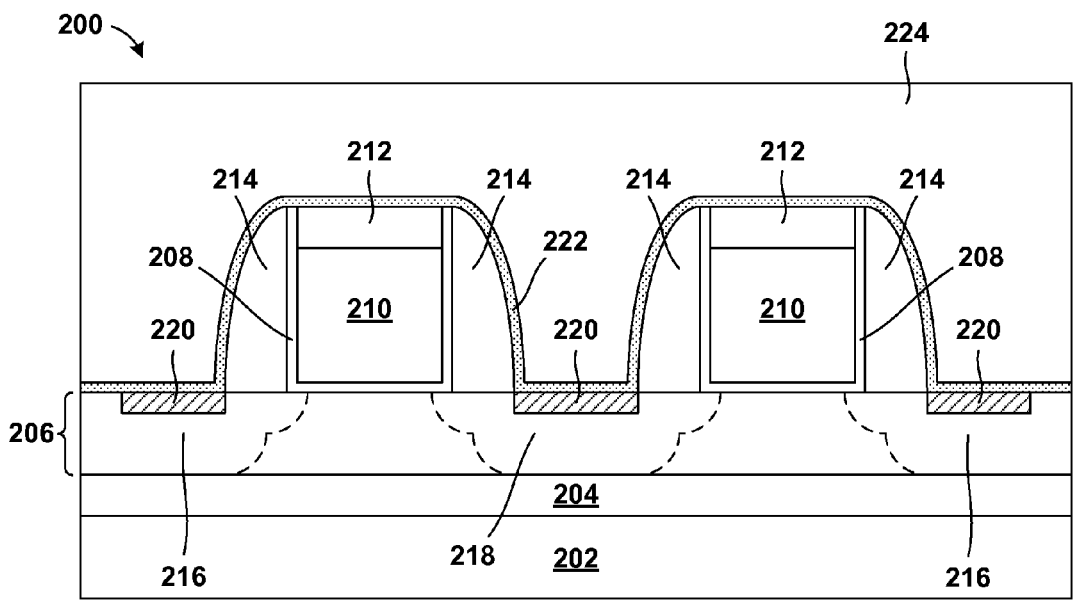

Referring now to FIG. 10, a non-conductive liner 222 may be deposited on top of the structure 200. In one embodiment, the non-conductive liner 222 may include, but is not limited to, a material made from tantalum nitride, ruthenium nitride, or any combination of these materials. The non-conductive liner 122 may be deposited using any suitable deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof.

The non-conductive liner 222 should serve as a dielectric barrier layer, to prevent the transmission of electrical current. In one embodiment, the non-conductive liner 222 may include tantalum nitride deposited using an atomic layer deposition (ALD) technique. Atomic layer deposition may be the preferred method of depositing the non-conductive liner 222 because its uniformity and controllability. Tantalum nitride is a well-known barrier against copper diffusion. When tantalum nitride is deposited from the vapor phase using ALD the non-conductive $Ta_3N_5$ phase is always obtained due to the low deposition temperatures normally encountered in ALD. The non-conductive liner 222 may have a thickness ranging from about 2 nm to about 20 nm, although a thickness of the non-conductive liner 222 less than 2 nm or greater than 20 nm is acceptable. More typically, the non-conductive liner 222 may have a thickness ranging from about 4 nm to about 10 nm.

A contact-level dielectric 224 may be deposited on top of the structure 200 using any suitable deposition technique known in the art. In one embodiment, the inter-level dielectric 224 may include, but is not limited to, a material made from, a nitride, an oxide, a carbide, or any combination of these materials. In one embodiment, the contact-level dielectric 224 may include an oxide deposited using a CVD deposition technique. The contact-level dielectric 224 may have a thickness ranging from about 20 nm to 100 nm, although a thickness of the non-conductive liner 222 less than 20 nm or greater than 100 nm is acceptable. The contact-level dielectric 224 may be planarized using a chemical-mechanical polishing technique after being formed on top of the structure 200.

Figure 11:
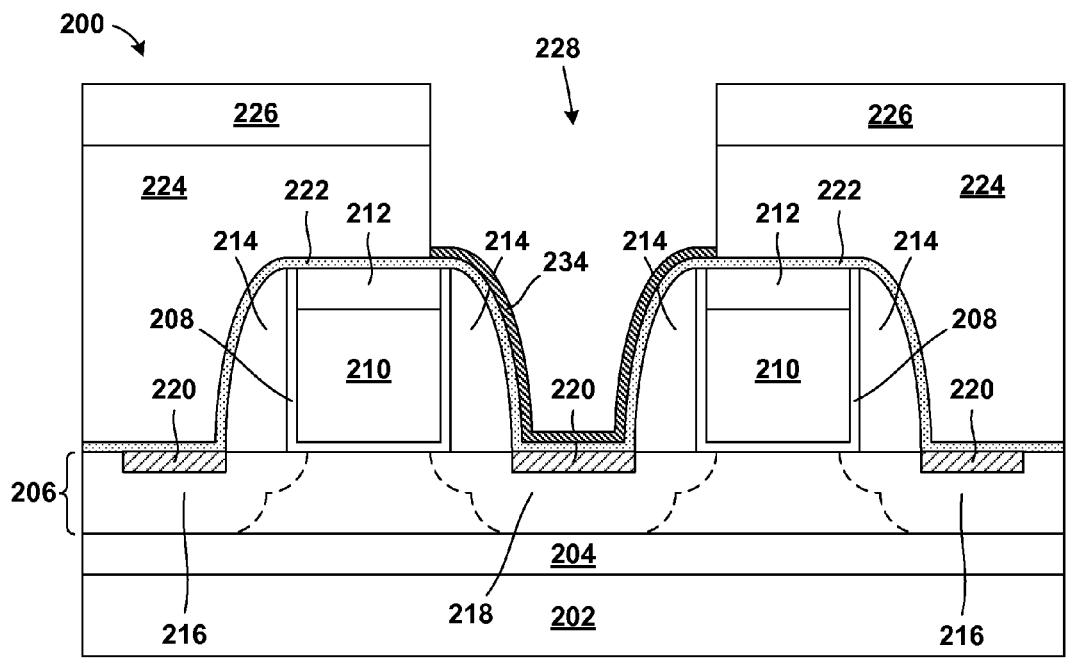

Referring now to FIG. 11, a mask 226 may be applied above the contact-level dielectric 224, and a contact hole 228 may be etched through the contact-level dielectric 224 to expose the embedded silicide contacts 220. A person having ordinary skill in the art will recognize that in various embodiments, a contact "hole" may be a circular opening or a trench extending for a length on the SOI layer 206. A portion of the contact-level dielectric 224 may be removed using any suitable etching technique such as dry etch, wet etch, or combination of both, however, the removal technique may be selective to the non-conductive liner 222. In one embodiment, reactive ion etching may be used to form the contact hole 228 selective to the non-conductive liner 222. The non-conductive liner 222 functions as an etch stop during the removal of the portion of the contact-level dielectric 224 and the formation of the contact hole 228. If the non-conductive liner 222 were absent the pair of device spacers 214 may be damaged by the etching technique used to form the contact hole 228, and therefore may cause a short circuit between the metal gate 210 and a CA contact later formed in the contact hole 228.

Next, a nitrogen absorption layer 234 may be deposited on top of an exposed portion of the non-conductive liner 122. The nitrogen absorption layer 234 may include, for example, titanium, tungsten, or zirconium. In one embodiment, the nitrogen absorption layer 234 may include titanium. In one embodiment, the nitrogen absorption layer 234 may include tungsten. The nitrogen absorption layer 234 can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof.

In one embodiment, the deposition of the nitrogen absorption layer 234 may be selective as shown in FIG. 11 and be deposited only on top of the non-conductive liner 222 and not on a sidewall or a top surface of the contact-level dielectric 224. In one embodiment, the nitrogen absorption layer 234 may, however, be deposited on top of the non-conductive layer 222, and the sidewall and the top of the contact-level dielectric 224. Preferably, the mask 226 may be removed prior to depositing the nitrogen absorption layer 234. The mask 226 may be removed using any suitable etching technique such as dry etch, wet etch, or combination of both, however, the removal technique may be selective to the contact-level dielectric 224. The thickness of the nitrogen absorption layer 234, may range from about 2 nm to about 20 nm, although lesser and greater thicknesses may also be used. More typically, the thickness of the nitrogen absorption layer 234, may range from about 2 nm to about 6 nm. After deposition, a planarization process such as CMP may be performed to remove any contact metal above the contact-level dielectric 224.

Figure 12:
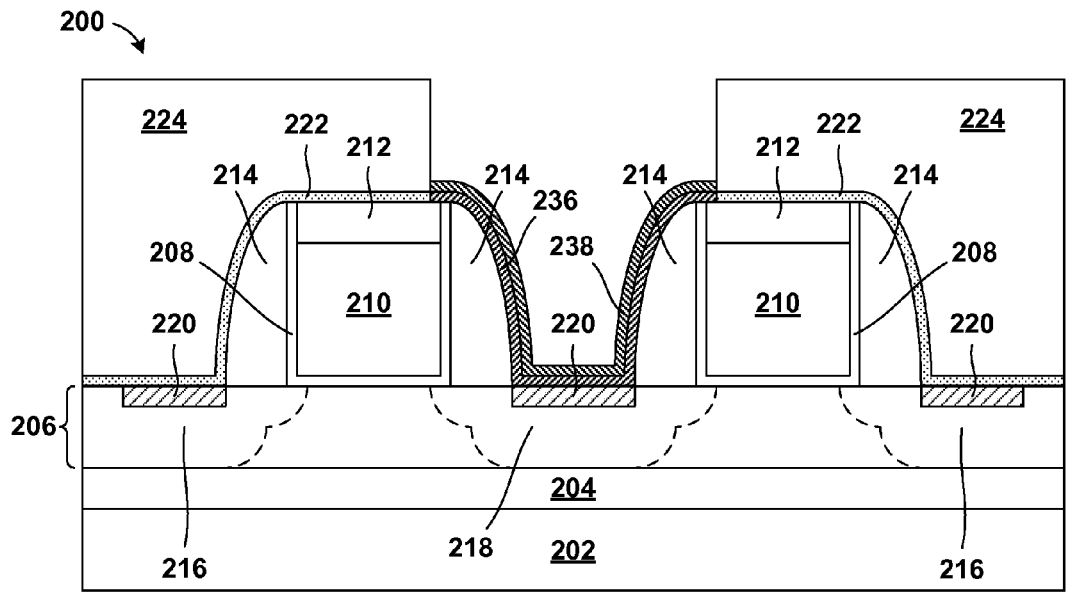

Referring now to FIG. 12, after deposition of the nitrogen absorption layer 234, a thermal annealing step may be carried out. The conditions for the annealing process are well known to persons having ordinary skill in the art. The annealing process causes the nitrogen absorption layer 234 to absorb nitrogen from the non-conductive liner 222 (for example $Ta_3N_5$). This absorption of nitrogen causes the non-conductive liner 222 to be transformed to a first conductive liner 236 (for example TaN). In other words, a non-conductive $Ta_3N_5$ may be converted to a conductive TaN as a result of the absorption of nitrogen by the nitrogen absorption layer 234 caused by the annealing process. After the annealing process the nitrogen absorption layer 234 may then become a second conductive layer 238. The second conductive layer 238 may become a nitrogen rich layer, for example, TiN or TaN, due to the absorption of nitrogen from the non-conductive layer 222. It may be understood by a person having ordinary skill in the art that $Ta_3N_5$ may have a considerably higher electrical resistance than TaN. Therefore, both the first and second conductive liners 236, 238 are both electrically conductive and may allow for the formation of a CA contact without the need for their removal. Furthermore, because of their electrically conductive properties, the first and second conductive liners 236, 238 do not reduce the effective width of a subsequently formed CA contact.

Figure 13:
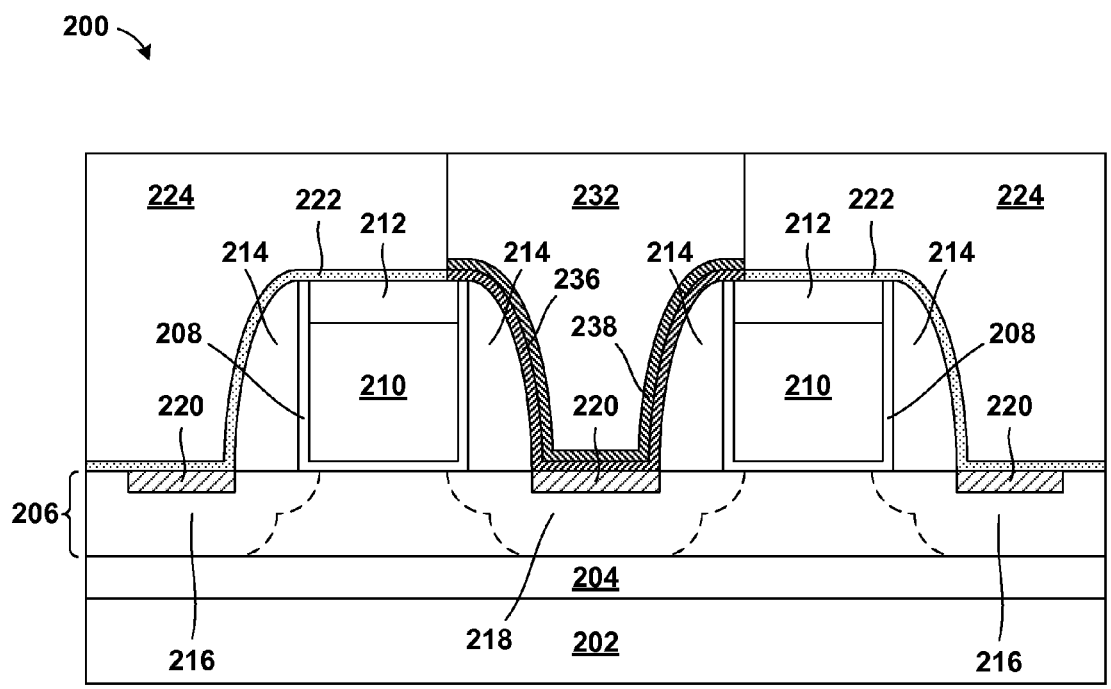

Now referring to FIG. 13, a conductive material 232 may be deposited to fill the contact hole 228. The conductive material 232 may include a material having a high electrical conductivity. The conductive material 232 can include, for example: tungsten, copper, aluminum, silver, gold, alloys thereof, and any suitable combination thereof. The conductive material 232 can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The thickness, or depth, of the conductive material 232, may range from about 30 nm to about 600 nm, although lesser and greater thicknesses may also be used. After deposition, a planarization process such as CMP may be performed to remove any contact metal above the contact-level dielectric 224.

Therefore, converting the non-conductive liner 222 to a conductive liner 230 by the addition of the nitrogen absorption layer 234 has multiple advantages over known techniques of fabricating a borderless CA contact. First, the non-conductive liner 222 may serve as a sufficient etch stop during etching of the contact hole 228. Second, because of the conductive properties of both the subsequently formed conductive liner 130 and the nitrogen absorption layer 234 removal of either the non-conductive liner 222 or the nitrogen absorption layer 234 may not be necessary to obtain the maximum possible CA contact width. Because the non-conductive liner 222 is never removed, an etching step may be eliminated, thus greatly reducing the possibility of damaging the pair of device spacers 214. Third, both the remaining conductive liner 230 and the nitrogen absorption layer 234 may neither unnecessarily constrict the width of the CA contact nor unnecessarily increase the CA contact's resistance because of there conductive properties.

Figure 14:
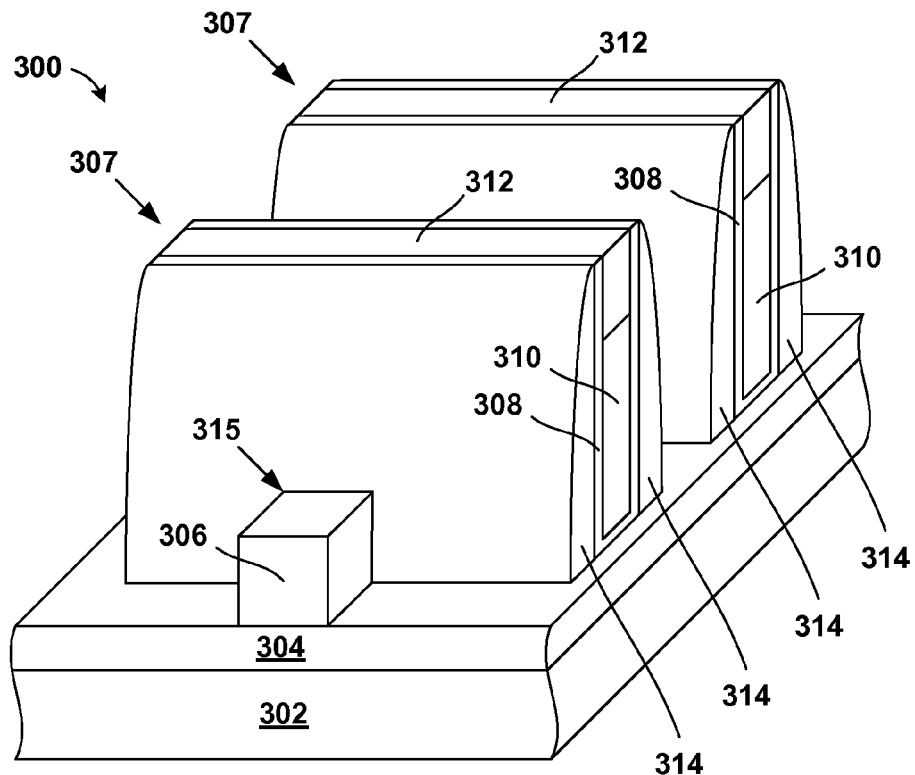
FIG. 14 depicts an isometric view of a finFET semiconductor device according to one embodiment.

Referring now to FIG. 14, an isometric view of a structure 300 is shown at an intermediate step during replacement gate process flow. At this step of fabrication the structure 300 may be generally complete with a gate structure 307 formed over a fin 315 etched from a semiconductor-on-insulator (SOI) substrate and after an inter-level dielectric has been removed. It should be noted that the gate structure 307 may be formed in any semiconductor substrate know to a person having ordinary skill in the art, including but not limited to SOI substrates and bulk silicon substrates. Also, it should be noted that while this description refers to some components of the structure 300 in the singular tense, more than one component may be depicted throughout the figures and like components are labeled with like numerals.

The SOI substrate employed in the present invention may include a base substrate 302, a buried dielectric layer 304 (e.g., buried oxide) formed on top of the base substrate 302, and a SOI layer 306 formed on top of the buried dielectric layer 304. The buried dielectric layer 304 isolates the SOI layer 306 from the base substrate 302. The base substrate 302 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 302 may be about, but is not limited to, several hundred microns thick. For example, the base substrate 302 may include a thickness ranging from 0.5 mm to about 1.5 mm.

The buried dielectric layer 304 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 304 may include crystalline or non-crystalline dielectric material. Moreover, the buried dielectric layer 304 may be formed using any of several known methods. Non-limiting examples include ion implantation methods, thermal or plasma oxidation or nitridation methods, chemical vapor deposition methods and physical vapor deposition methods. In one embodiment, the buried dielectric layer 304 may be about 150 nm thick. Alternatively, the buried dielectric layer 304 may include a thickness ranging from about 10 nm to about 500 nm.

The SOI layer 306 may include any of the several semiconductor materials included in the base substrate 302. In general, the base substrate 302 and the SOI layer 306 may include either identical or different semiconducting materials with respect to chemical composition, dopant concentration and crystallographic orientation. In one particular embodiment of the present invention, the base substrate 302 and the SOI layer 306 include semiconducting materials that include at least different crystallographic orientations. Typically the base substrate 302 or the SOI layer 306 include a {110} crystallographic orientation and the other of the base substrate 302 or the SOI layer 306 includes a {100} crystallographic orientation. Typically, the SOI layer 306 includes a thickness ranging from about 5 nm to about 100 nm. Methods for forming the SOI layer 306 are well known in the art. Non-limiting examples include SIMOX (Separation by Implantation of Oxygen), wafer bonding, and ELTRAN® (Epitaxial Layer TRANsfer).

The fins 315 may be etched from the SOI substrate using typical photolithography techniques. The fins 315 may be primarily formed from the SOI layer 306 of the SOI substrate. In one embodiment the fins 315 may include multiple layers in addition to the SOI layer 306 of the SOI substrate. For example, an oxide layer (not shown) and a nitride layer (not shown) may be formed on a top surface of the SOI layer 306, where the nitride layer may be located directly on top of the oxide layer.

The oxide layer may include a silicon oxide or a silicon oxynitride. In one embodiment, the oxide layer can be formed, for example, by thermal or plasma conversion of a top surface of the SOI layer 306 into a dielectric material such as silicon oxide or silicon oxynitride. In one embodiment, the oxide layer can be formed by deposition of silicon oxide or silicon oxynitride by chemical vapor deposition (CVD) or atomic layer deposition (ALD). The oxide layer may have a thickness ranging from about 1 nm to about 10 nm, although a thickness less than 1 nm and greater than 10 nm may be acceptable. In one embodiment, the oxide layer may be about 5 nm thick.

The nitride layer may include an insulating material such as, for example, silicon nitride. The nitride layer may be formed using conventional deposition methods, for example, low-pressure chemical vapor deposition (LPCVD). In one embodiment, the nitride layer may have a thickness ranging from about 5 nm to about 100 nm. In one particular embodiment, the nitride layer may be about 50 nm thick.

The gate structure 307 may include a gate dielectric 308, a metal gate 310, a gate cap 312, and a pair of device spacers 314. The gate dielectric 308 may be formed after removal of the dummy gate during the replacement gate process flow. The gate dielectric 308 can be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The gate dielectric 308 may also be formed using any combination of the above processes.

The gate dielectric 308 may include an insulating material including, but not limited to: oxide, nitride, oxynitride or silicate including metal silicates and nitrided metal silicates. In one embodiment, the gate dielectric 308 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric 308 may vary, but typically may have a thickness ranging from about 0.5 nm to about 10 nm. More preferably the gate dielectric 308 may have a thickness ranging from about 0.5 nm to about 3 nm.

The metal gate 310 may be formed on top of the gate dielectric 308. The metal gate 310 may be deposited by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). The metal gate 310 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC), and any combination of those materials. In one embodiment, the metal gate 310 may include tungsten. Furthermore, the gate cap 312 may be formed on top of the metal gate 310 using any suitable deposition technique known in the art. The gate cap 312 may include, for example, TiN, W, Ti, Al, Ta, TaN, Co, and Ni.

The gate dielectric 308, the metal gate 310, the gate cap 312 may be referred to as a gate stack. The gate stack may have the pair of device spacers 314 located on opposite sidewalls of the gate stack; however, in a replacement gate process flow the pair of device spacers 314 may be formed around a dummy gate stack prior to the formation of the gate dielectric 308, the metal gate 310, the gate cap 312. The pair of device spacers 314 may be made from an insulator such as an oxide, nitride, oxynitride, or any combination thereof. The pair of device spacers 314 may be typically made from a different material than the gate cap 312. In one embodiment, the pair of device spacers 314 may be made form a nitride and may be formed by conventional deposition and etching techniques.

Figure 15:
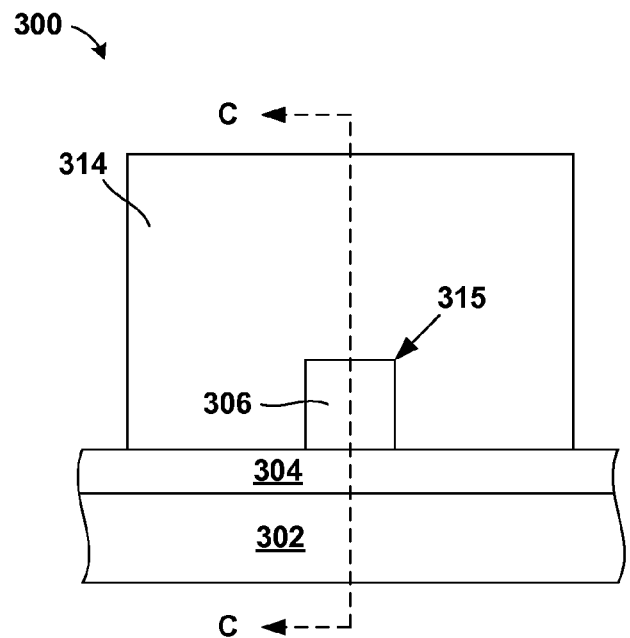
FIG. 15 depicts the front view of FIG. 14 according to one embodiment.

Referring now to FIG. 15, a front view of the structure 300 in FIG. 1 is shown. In the front view, only the base substrate 302, the buried dielectric layer 304, the SOI layer 306 (i.e. the fin 315), and one of the pair of device spacers 314 are visible.

Referring now to FIGS. 16-20, exemplary process steps of forming FETs, such as finFETs, having a borderless CA contact in accordance with one embodiment of the present invention are shown, and will now be described in greater detail below. It should be noted that FIGS. 16-20 all represent the cross section view, section C-C, of FIG. 15. The borderless CA contact may be formed between two adjacent semiconductor devices as depicted in FIGS. 16-20. Generally, a borderless CA contact may be used when the spacing between the two adjacent semiconductor devices is less than the current ground rule limitations. For example, in 22 nm processes, the ground rules may limit the formation of a contact to a minimum of 30 nm. Therefore, maximizing the effective width of a CA contact is important when the minimum width of the contact is greater than the distance between two adjacent semiconductor devices.

Figure 16:
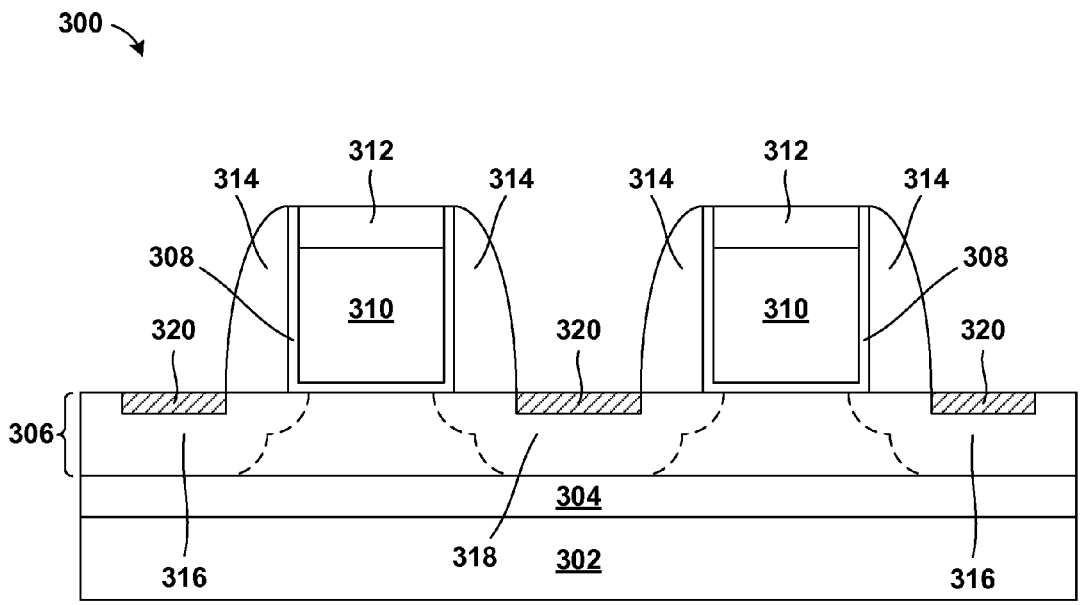
FIGS. 16-20 depict section C-C of FIG. 15 and illustrate the steps of a method of fabricating a borderless CA contact according to one embodiment.

Referring now to FIG. 16, the structure 300 is shown after the removal of the inter-level dielectric. The SOI layer 306 may be doped, undoped, or contain both doped and undoped regions therein. These doped regions can be used to define various device regions, for example a source region 316 and a drain region 318. The source/drain regions 316, 318, for example, may be either n-doped or p-doped. Typically, n-doped source/drain regions are used for forming n-channel field effect transistors (n-FETs), and p-doped source/drain regions are used for forming p-channel field effect transistors (p-FETs). However, the source/drain regions of one device on a semiconductor substrate may be n-doped while the source/drain regions of another device on the same semiconductor substrate may be p-doped. The source/drain regions 316, 318 can be formed using ion implantation process followed by an annealing process. The annealing process serves to activate the dopants that were implanted by the previous implant process. The conditions for the ion implantation and annealing are well known to persons having ordinary skill in the art. The phrase "source/drain regions" may include extension regions, halo regions, and deep source/drain regions. It should be noted that the source drain regions 316, 318 may be formed by doping the SOI layer 306 either before the formation of the inter-level dielectric in the replacement gate process flow or after the removal of the inter-level dielectric as the shown in FIG. 3.

With continued reference to FIG. 16, embedded silicide contacts 320 may be formed in the source/drain regions 316, 318 within the SOI layer 306. The embedded silicide contacts 320 may be formed by first depositing a metal alloy layer (not shown). The metal alloy layer may be formed using known any suitable deposition technique known in the art including, but not limited to: chemical vapor deposition (CVD), plasma-assisted CVD, high-density chemical vapor deposition (HD-CVD), plating, sputtering, evaporation, and chemical solution deposition. The deposition of the metal alloy layer may be continued until an initial thickness of about 25 nm or less, preferably about 15 nm or less, even more preferably about 10 nm or less, is produced.

In one embodiment, the metal alloy layer may include a nickel-platinum (NiPt) alloy. The metal alloy layer may include a nickel concentration ranging from about 70 to about 95 atomic percent. Preferably, nickel may be present in the alloy in an amount ranging from about 90 to about 95 atomic percent. The remainder may be platinum and, if present, another metal. In one embodiment, the metal alloy layer may include NiPd, NiRe, Ti, TiTa, TiNb, or Co.

The other metal or alloying additive that can be optionally present in the NiPt alloy layer may include Pd, Rh, Ti, V, Cr, Zr, Nb, Mo, Ht, Ta, W, or Re. In one embodiment, the other alloying additive may be Re. When present, the alloying additive is present in an amount ranging from about 0 to about 50 atomic percent with an amount ranging from about 0.1 to about 20 atomic percent being more typical. More preferably, the other metal is present in an amount ranging from about 0.5 to about 10 atomic percent.

Next, an annealing step may be carried out at a relatively low annealing temperature, ranging from about 150° C. to about 500° C. using either a continuous heating regime or various ramp and soak heating cycles, for a duration ranging from about 1 second to about 1000 seconds. More preferably, the annealing step may be carried out at an annealing temperature ranging from about 200° C. to about 400° C. and for a duration ranging from about 5 seconds to about 500 seconds. Most preferably, the annealing step may be carried out at an annealing temperature ranging from about 250° C. to about 350° C. and for a duration ranging from about 10 seconds to about 100 seconds. In one embodiment, the annealing step may be initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the annealing step may be terminated by lowering the surrounding temperature of the entire structure to below 100° C. within a time period from about 10 seconds to about 1000 seconds.

The annealing step, as described above, may be generally referred to as a low-temperature rapid thermal annealing (RTA) step. As a result of the low-temperature RTA step, nickel contained in the portions of the metal alloy layer located directly over the source/drain regions 316, 318 of the SOI layer 306 reacts with silicon contained in the source/drain regions 316, 318 to form the embedded silicide contacts 320. The embedded silicide contacts 320 may include, at a minimum, nickel and silicon. In some embodiments, the nickel silicides may also include another metal or alloying additive as discussed above. The embedded silicide contacts 320 formed after the low-temperature RTA step, may extend into the silicon material of the source/drain regions 316, 318 about 5 nm to about 30 nm, with a depth from about 5 nm to about 20 nm being even more typical. Any suitable etching technique known in the art may be used to remove an unreacted portion of the metal alloy layer remaining on any non-silicon containing surfaces.

Figure 17:
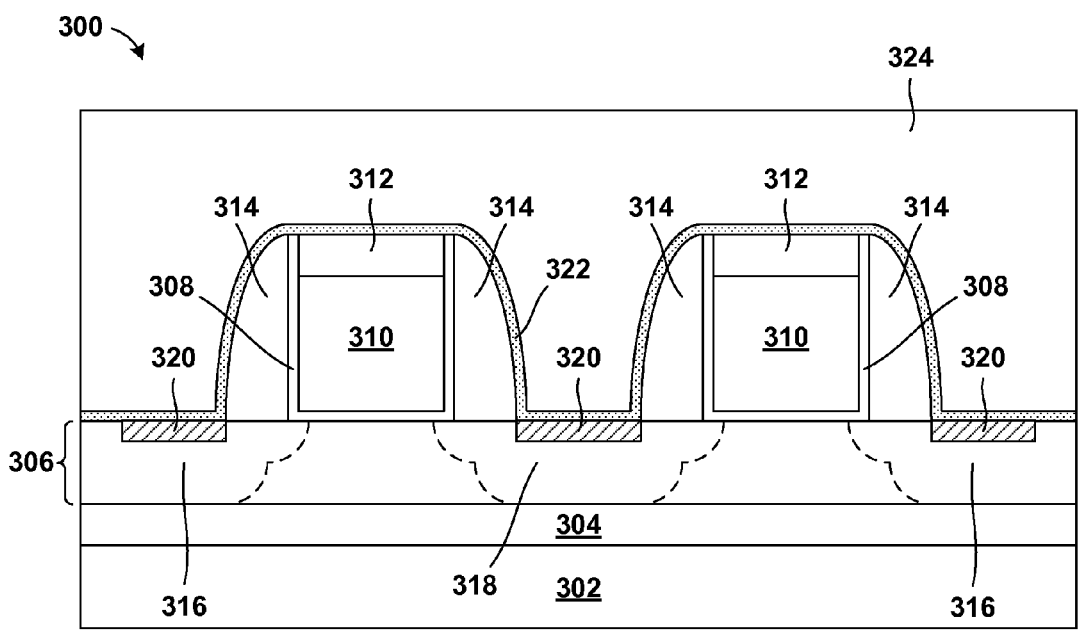

Referring now to FIG. 17, a non-conductive liner 322 may be deposited on top of the structure 300. The non-conductive liner 322 may be deposited using any suitable deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof.

The non-conductive liner 322 may be any suitable material known in the art which is an insulator and resistive to etching, specifically reactive ion etching (RIE). For example, the non-conductive liner 322 may include, but is not limited to, hafnium oxide, aluminum oxide, or any combination of these materials. The non conductive liner 322 should serve as a dielectric barrier layer, to prevent the transmission of electrical current. Preferably, the non-conductive liner 322 may be a different material than the pair of device spacers 314. In one embodiment, the non-conductive liner 322 may include hafnium oxide deposited using an ALD deposition technique. Atomic layer deposition may be the preferred method of depositing the non-conductive liner 322 because its uniformity and controllability. Hafnium oxide is a well-known barrier against copper diffusion. The non-conductive liner 322 may have a thickness ranging from about 2 nm to about 20 nm, although a thickness of the non-conductive liner 322 less than 2 nm or greater than 20 nm is acceptable. More typically, the non-conductive liner 322 may have a thickness ranging from about 4 nm to about 10 nm.

A contact-level dielectric 324 may be deposited on top of the structure 300 using any suitable deposition technique known in the art. In one embodiment, the contact-level dielectric 324 may include, but is not limited to, a material made from, a nitride, an oxide, a carbide, or any combination of these materials. In one embodiment, the contact-level dielectric 324 may include an oxide deposited using a CVD deposition technique. The contact-level dielectric 324 may have a thickness ranging from about 20 nm to 100 nm, although a thickness of the non-conductive liner 322 less than 20 nm or greater than 100 nm is acceptable. The contact-level dielectric 324 may be planarized using a chemical-mechanical polishing technique after being formed on top of the structure 300.

Figure 18:
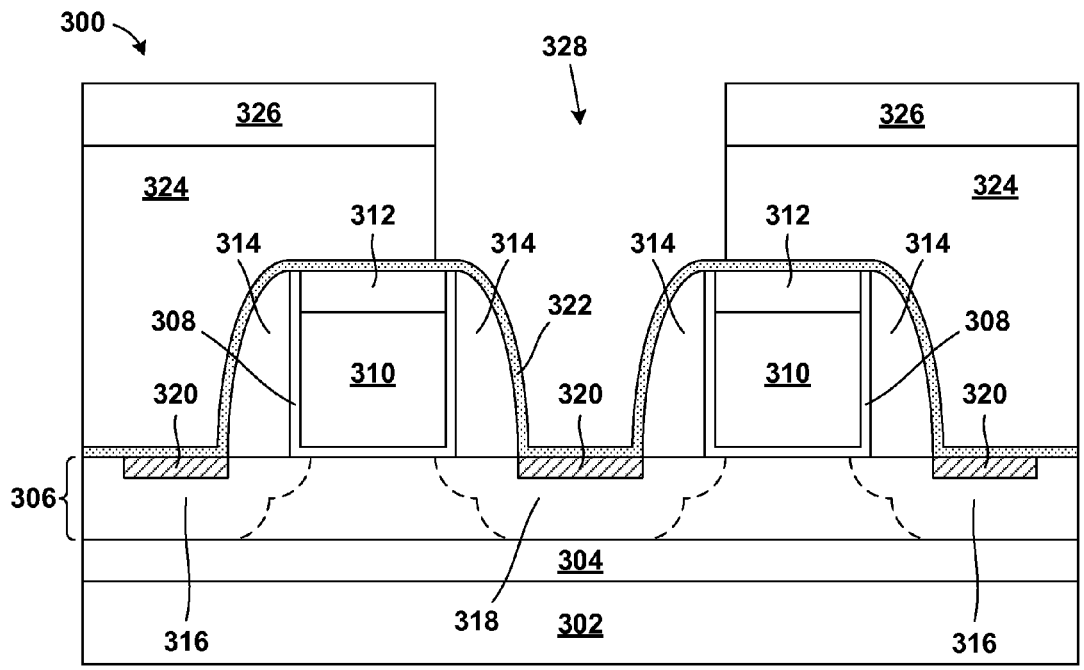

Referring now to FIG. 18, a mask 326 may be applied above the contact-level dielectric 324, and a contact hole 328 may be etched through the contact-level dielectric 324 to expose embedded silicide contacts 320. A person having ordinary skill in the art will recognize that in various embodiments, a contact "hole" may be a circular opening or a trench extending for a length on the SOI layer 306. A portion of the contact-level dielectric 324 may be removed using any suitable etching technique such as dry etch, wet etch, or combination of both, however, the removal technique may be selective to the non-conductive liner 322. In one embodiment, reactive ion etching (RIE) may be used to form the contact hole 328 selective to the non-conductive liner 322. The non-conductive liner 322 functions as an etch stop during the removal of the portion of the contact-level dielectric 324 and the formation of the contact hole 328. If the non-conductive liner 322 were absent the pair of device spacers 314 may be damaged by the etching technique used to form the contact hole 328, and therefore may cause a short circuit between the metal gate 310 and a CA contact later formed in the contact hole 328.

Figure 19:
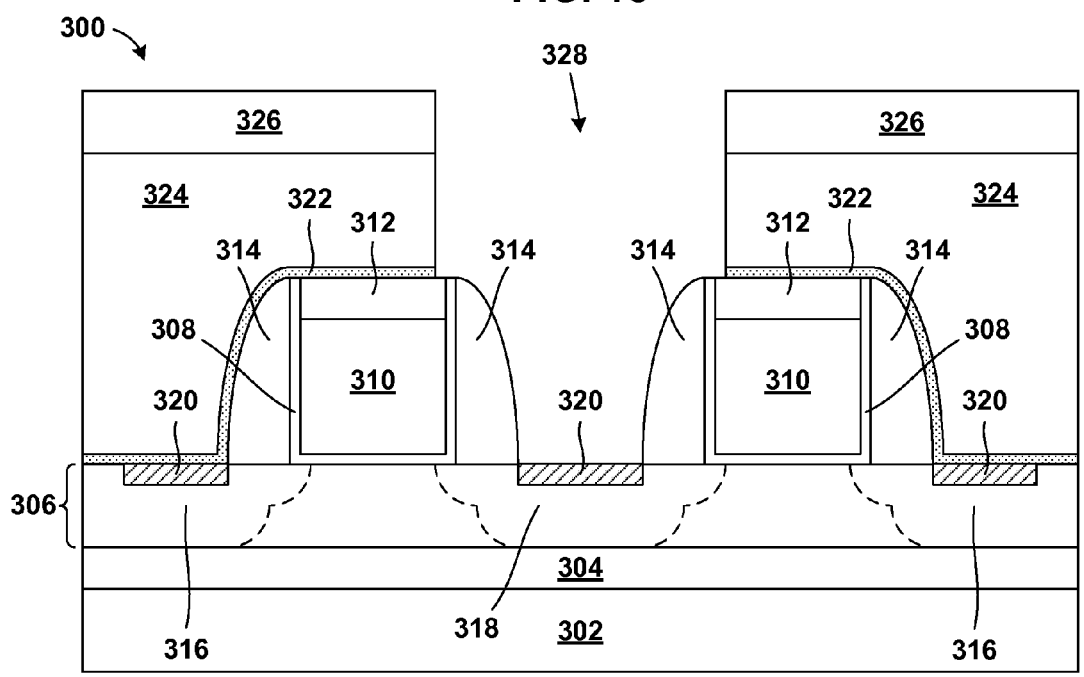

Referring now to FIG. 19, a removal process may be used to remove an exposed portion of the non-conductive liner 322 from within the contact hole 328 selective to the pair of device spacers 314. removal of the non-conductive liner 322 without causing damage to the pair of device spacers 314 may be possible because the non-conductive liner 322 may be a different material than the pair of device spacers 314. Damage to the pair of device spacers may be result in cases where the non-conductive liner 322 may be a similar or same material as the pair of device spacers 314. Any damage to the pair of device spacers is undesirable because there is an increased risk of an electrical short forming between the metal gate 310 and a subsequently formed contact formed in the contact hole 328. A portion of the non-conductive liner 322 may remain beneath the contact-level dielectric 324 after the removal process. In one embodiment, the non-conductive liner 322 may be removed using a high temperature high-k etching technique.

The mask 326 may be removed either before or after the removal of the exposed portion of the non-conductive liner 322. The mask 326 may be removed using any suitable etching technique such as dry etch, wet etch, or combination of both, however, the removal technique may be selective to the contact-level dielectric 324, the pair of device spacers 314, and the embedded silicide 320. Preferably, the mask 326 may be removed before removal of the exposed portion of the non-conductive liner 322 to minimize the risk of causing damage to the pair of device spacers 314.

Figure 20:
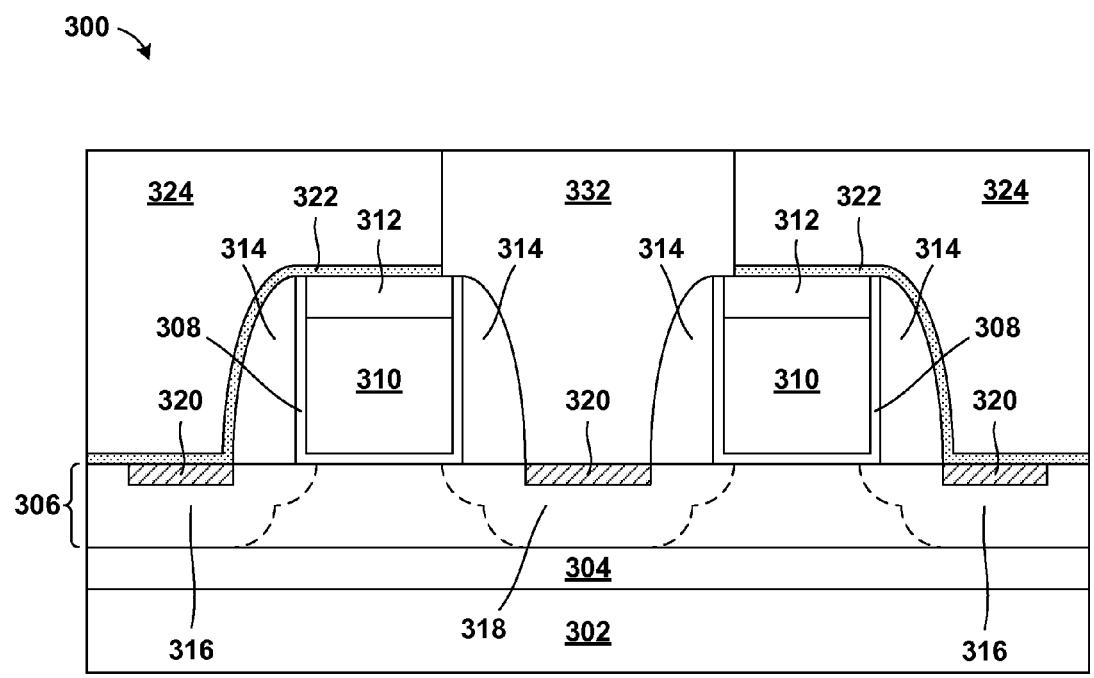

Now referring to FIG. 20, a conductive material 332 may be deposited to fill the contact hole 328. The conductive material 332 may include a material having a high electrical conductivity. The conductive material 332 can include, for example: tungsten, copper, aluminum, silver, gold, alloys thereof, and any suitable combination thereof. The conductive material 332 can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The thickness, or depth, of the conductive material 332, may range from about 30 nm to about 600 nm, although lesser and greater thicknesses may also be used. After deposition, a planarization process such as CMP may be performed to remove any contact metal above the contact-level dielectric 324.

Therefore, placement and subsequent removal of the non-conductive liner 322 has advantages over known techniques of fabricating a borderless CA contact. First, the non-conductive liner 222 may serve as a sufficient etch stop during etching of the contact hole 228. Second, removal of the non-conductive liner 322 allows the benefit of maximum CA contact width; however, there remains the risk of damaging the device spacers 314 during the removal of the non-conductive liner 322.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of fabricating a semiconductor structure having a borderless contact, the method comprising:
   providing a first semiconductor device adjacent to a second semiconductor device, the first and second semiconductor devices being formed on a semiconductor substrate;
   depositing a non-conductive liner on top of the semiconductor substrate and the first and second semiconductor devices;
   depositing a contact level dielectric layer on top of the non-conductive liner;
   etching a contact hole in the contact-level dielectric between the first semiconductor device and the second semiconductor device, and selective to the non-conductive liner, to expose a first portion of the non-conductive liner;
   depositing a nitrogen absorption layer on top of the first portion of the non-conductive liner exposed within the contact hole; and
   performing a thermal anneal causing the nitrogen absorption layer to absorb nitrogen from the non-conductive liner, and causing an entire thickness of the first portion of the non-conductive liner to change from an insulator to a conductor.

2. The method of claim 1, wherein the non-conductive liner is $Ta_3N_5$.

3. The method of claim 1, wherein the conductive liner is TaN.

4. The method of claim 1, wherein performing the thermal anneal comprises changing the non-conductive liner from $Ta_3N_5$ to TaN.

5. The method of claim 1, wherein the nitrogen absorption layer comprises titanium, tungsten or zirconium.

6. A method of fabricating a semiconductor structure having a borderless contact, the method comprising:
   providing a first semiconductor device adjacent to a second semiconductor device, the first and second semiconductor devices being formed on a semiconductor substrate;
   depositing a non-conductive liner on top of the semiconductor substrate and the first and second semiconductor devices, the non-conductive liner comprising ruthenium-nitride;

depositing a contact level dielectric layer on top of the non-conductive liner;

etching a contact hole in the contact-level dielectric between the first semiconductor device and the second semiconductor device, and selective to the non-conductive liner to expose a first portion of the non-conductive liner; and converting an entire thickness of the first portion of the non-conductive liner exposed in the contact hole into a conductive liner.

7. The method of claim 6, wherein converting the entire thickness of the first portion of the non-conductive liner exposed in the contact hole into a conductive liner comprises:

performing a plasma bombardment technique on the portion of the non-conductive liner exposed in the contact hole, and causing the portion of the non-conductive liner to change from an insulator to a conductor.

8. The method of claim 6, wherein converting the entire thickness of the first portion of the non-conductive liner exposed in the contact hole into a conductive liner comprises:

depositing a nitrogen absorption layer on top of the first portion of the non-conductive liner exposed within the contact hole; and performing a thermal anneal causing the nitrogen absorption layer to absorb nitrogen from the non-conductive nitride liner, and causing the entire thickness of the first portion of the non-conductive liner to change from an insulator to a conductor.

* * * * *